(12) United States Patent
Tooher

(10) Patent No.: US 6,229,746 B1
(45) Date of Patent: May 8, 2001

(54) PULSE GENERATOR CIRCUITRY FOR TIMING A LOW-POWER MEMORY DEVICE

(75) Inventor: Michael Tooher, Stuttgart (DE)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/363,797

(22) Filed: Jul. 29, 1999

(30) Foreign Application Priority Data

Jul. 30, 1998 (IT) ............................................. MI98A1768

(51) Int. Cl.$^7$ ........................................................ G11C 7/02
(52) U.S. Cl. ............................................................ 365/210
(58) Field of Search .................................. 365/210, 203, 365/194

(56) References Cited

U.S. PATENT DOCUMENTS

| 5,132,931 | * | 7/1992 | Koker | 365/210 |
| 5,289,403 | * | 2/1994 | Yetter | 365/210 |
| 5,596,539 | * | 1/1997 | Passow et al. | 365/210 |
| 5,742,552 | * | 4/1998 | Greenberg | 365/210 |
| 5,828,612 | * | 10/1998 | Yu et al. | 365/203 |
| 5,844,851 | * | 12/1998 | Pascucci et al. | 365/210 |
| 6,009,040 | * | 12/1999 | Choi et al. | 365/233 |
| 6,061,286 | * | 5/2000 | Baroni et al. | 365/203 |

\* cited by examiner

Primary Examiner—Trong Phan
(74) Attorney, Agent, or Firm—Theodore E. Galanthay; Jon A. Gibbons; Fleit, Kain, Gibbons, Gutman & Bongini P.L.

(57) ABSTRACT

The invention relates to a pulse generator circuitry for timing a low-power memory device of a type associated to a memory matrix, including a plurality of word lines driven by a row decoder, and a plurality of bit lines sensed by sense amplifiers. The matrix includes at least a dummy row and at least one dummy column. A delay chain of the pulse generator is formed by the dummy datapath of the memory matrix. The dummy datapath being defined by at least on dummy row and at least one dummy column. The datapath operates prior to the operation of the normal row and column path of the matrix.

In another embodiment disclosed, the row decoder comprises a dummy row enable portion at the intersection between the dummy row and the dummy column. The delay chain includes at least the dummy row enable portion, the dummy row and the dummy column.

19 Claims, 4 Drawing Sheets

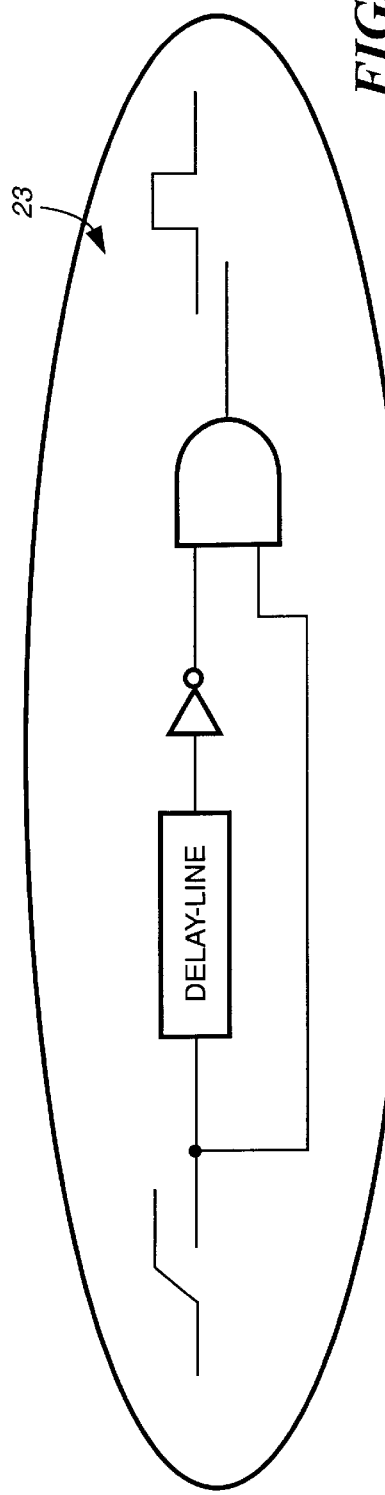
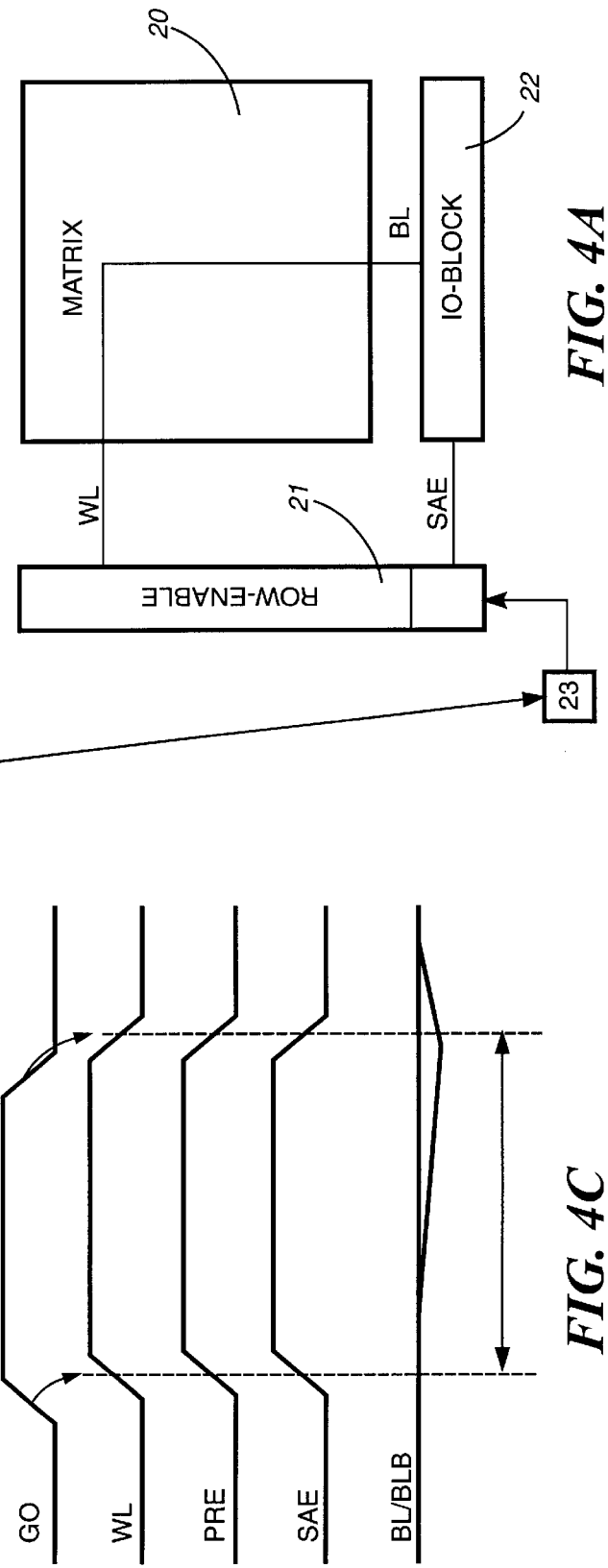
FIG. 4A
FIG. 4B
FIG. 4C

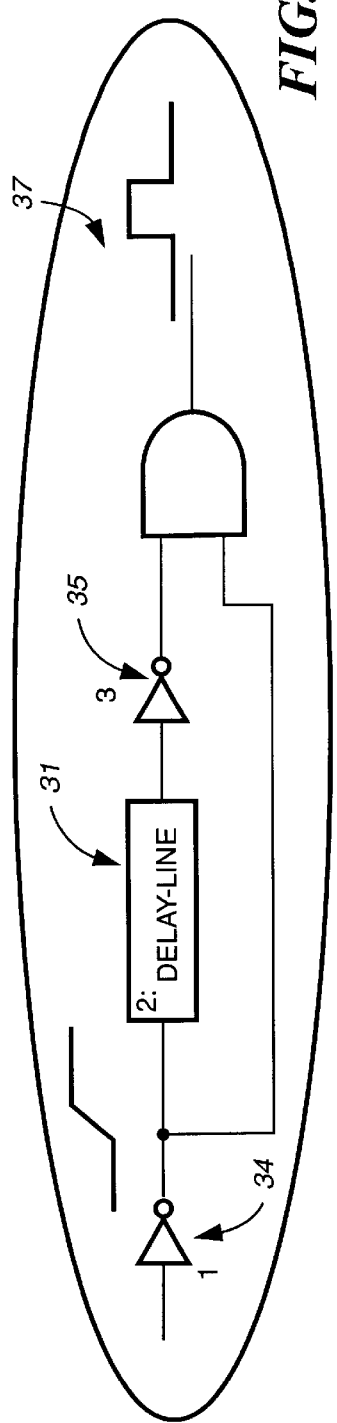
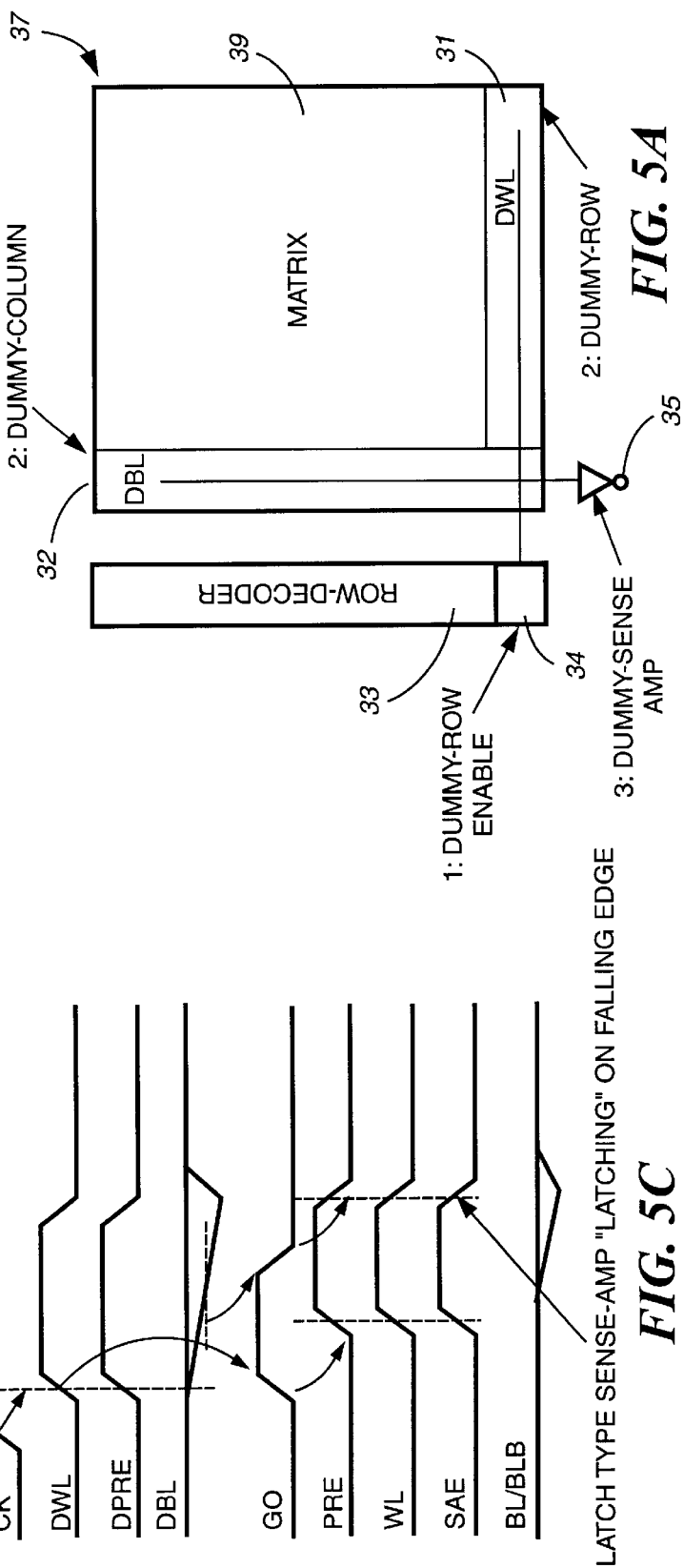
FIG. 5A
FIG. 5B
FIG. 5C

PULSE GENERATOR CIRCUITRY FOR TIMING A LOW-POWER MEMORY DEVICE

CROSS-REFERENCE TO RELATED APPLICATIONS

This application is based upon and claims priority from prior an Italian Patent Application No. MI98-A-001768, filed Jul. 30, 1998, the entire disclosure of which is herein incorporated by reference.

BACKGROUND OF THE INVENTION

1. Field of the Invention

The present invention relates to integrated memory circuits and, more particularly, to an integrated static random access memory SRAM.

More specifically, the invention relates to a pulse generator circuitry for timing a low-power memory device of a type associated to a memory matrix including a plurality of word lines driven by a row decoder and a plurality of bit lines sensed by sense amplifiers, the matrix including at least a dummy row and a dummy column.

2. Description of the Related Art

As is well known in such a specific technical field, an electronic random access memory device includes a plurality of basic memory cells each comprising six transistors.

The enclosed FIG. 1 shows an example of a basic six transistors memory cell which is constructed with CMOS technology. The cell 1 shown in FIG. 1 includes a pair of cross-coupled CMOS inverters 2 and 3 each of which is coupled to a corresponding bit line 4, 5 of the memory device. The first inverter 2 is coupled to the bit line 4 through a bi-directional access devices 6 while the second inverter 3 is coupled to the adjacent bit line 5 through a second bi-directional access devices 7.

During the reading and writing phases of the memory cell, a differential voltage must be applied between the bit lines 4, 5. In this respect, the cell access to the storage node is called "differential".

In the reading phase, the swing of bit line amplitude depends on how long the cells have been activated. The voltage difference due to the swing can be kept quite small and can be sensed by the sense amplifier of the memory device. This helps to reduce power consumption.

In the writing phase, the bit line voltage swing should be as large as possible, even a full CMOS level, in order to toggle the cells.

If we consider a RAM memory array or matrix having m rows and n columns, and including six transistors cells, the current consumption can be easily estimated using the following formulas:

$$Iddr = n*m*Cb*\Delta Vr*P \quad (1)$$

for the reading phase, and $$Iddw = n*m*Cb*\Delta Vw*P \quad (2)$$

for the writing phase;

where: Cb is the bit line capacitance associated to a given cell; $\Delta Vr$ is the read voltage bit line swing and $\Delta Vw$ is the write voltage bit line swing; P is the probability of a bitline switching during an operation. Usually $\Delta Vw$ corresponds to the supply voltage value Vdd.

Some prior art techniques are used to reduce the power dissipation of the memory matrix. Those techniques try to intervene on one or more of the parameters contained in the above formulas.

For instance, a first prior art solution is disclosed by N. Kushiyama et al. in an article entitled "A 295 Mhz CMOS 1M (x256) embedded SRAM using I-directional read/write shared sense amplifiers and self-timed pulsed word-line drivers", ISSCC Dig. Tech. Papers February 1995, pp. 182–183.

This first solution proposes to reduce power dissipation by reducing the number of cells hung on the bit line using a hierarchical bit line scheme.

A second prior art solution is disclosed by B. Amrutur and H. Horowitz in an article entitled "Technique to reduce power in fast wide memories", Dig. Tech. Papers, October 1994, Symp. on Low Power Electronics, pp 92–93.

This second solution proposes to reduce power dissipation limiting the read bit line swing by controlling the word line pulse length.

A third prior art solution is disclosed by T. Blalock and R. Jager in an article entitled "A high-speed clamped bit line current-mode sense amplifiers", IEEE J. Solid State Circuits, vol. 26, No. 4, pp. 542–548, April 1991.

Even this third solution proposes to reduce power dissipation limiting the read bit line swing, by using current-mode sense amplifiers; thus reducing $\Delta Vr$.

A further known solution proposes to limit the write bit line swing to a predetermined value, namely Vdd–Vt, using a NMOS transistors precharge phase.

Moreover, some attempts have already been performed to provide a self-timing control mechanism which could track the size of the memory device as well as process, voltage and temperature variations.

In this respect, a self-timing circuit architecture technique using dummy paths is well known in the art. Such a technique is disclosed by A. L. Silburt et al. in an article entitled, "A 180 Mhz 0.8 $\mu m$ BiCMOS Modular Memory Family of DRAMS and Multiport SRAM", IEEE J.Solid-State Circuits, vol. 28, No. 3, March 1993.

FIG. 2 shows a diagram of this classic self-timing architecture. A memory cells matrix 10 includes a plurality of word lines and a plurality of bit lines. The matrix 10 also includes a dummy-row 11 and a dummy column 12.

The dummy-row 11 represents a dummy path which has the same capacitive load as a common row of the memory matrix 10.

The dummy column 12 is formed by the same memory cells forming the columns of the matrix 10. The capacitance of the bit lines are the same as the dummy bit line represented by the dummy column 12.

A row decoder 13 is associated to the memory matrix 10. The dummy column 12 is driven by a dummy row decoder 14 which is a replica of the row decoder 13 portion driving each row of the matrix 10.

The row decoder 13 and the dummy row decoder 14 are enabled by a signal GO 17. Since the drive capabilities of the two decoders 13, 14 are the same and since the capacitative load of the memory rows and the dummy row are the same, the output signal DWL 18 will be tracked exactly as the signal WL 9.

At the intersection of the dummy row and the dummy column there is an active dummy cell 15. Such a dummy cell 15 is at least four times stronger than a normal cell of the memory matrix 10. In other words, the dummy cell 15 has the same capacitive loads of cells in memory matrix 10, but it is four times stronger and is activated simultaneously with the cells of the memory matrix 10.

The dummy column 12 discharges a signal dbl 19 four times faster than the other normal bit lines. When the dummy column 12 reaches a specific voltage value, it flips a detector 16. Such a voltage value is generally set at half the supply voltage Vdd so that the normal bit lines need to discharge a voltage value of Vdd/8 when the dummy bit line reaches the set value.

The signal dbl 19 is used to turn on sense amplifier 24 and to reset the memory device.

A diagram of the amplitudes versus time of the various signals is shown in FIG. 3.

The above type of timing circuit is advantageous for memory generators used in memories having a variable size since the above circuitry effectively tracks the size of the memory. See for instance the European patent application No. 92830644.8.

The above advantage is independent from from the number of rows and columns in the matrix; the sense amplifier control signal will always arrive at the point wherein the bit line discharge is given by the value Vdd/8. Moreover, since the control circuitry corresponds to the circuitry used in the real datapath, such a control circuitry reacts in the same way to changes in supply voltage, temperature and/or process variables.

Notwithstanding these advantages, the solution disclosed hereinabove has a shortcoming when the desired time to start a reset cycle corresponds to the time in which the sense amplifiers are turned on. A delay period shown in FIG. 3 as "Treset" 25 is therefore taken before the reset signal presents a falling edge. During this Treset period the bit lines are needlessly discharging and wasting power for no reason.

A reset signal is detected by the dummy dataline simultaneously to the point in time wherein the real bitlines have reached the "tuned" voltage difference value Vdd/8. So, the system must wait the Treset delay while the reset signal propagates through the memory device.

A further prior art solution provides a "one-shot" type of timing circuit. FIGS. 4A, 4B and 4C depict this second solution.

A memory matrix 20 is associated to a row-enable 21 circuit and to an I/O block 22.

A delay line 23, formed by a series of logic gates, provides a control signal pulse.

The pulse width doesn't track the changes in the size of the memory or variations in process, voltage or temperature.

The pulse, however, can turn off the bitline discharge while simultaneously turning on a latch type sense amplifier. Thus the discharge of the bit line, which causes the major power comsumption, is stopped as soon as it becomes unnecessary.

One object of the present invention is that of producing a timing circuit allowing a tight control on the voltage swing on the bitlines.

Another object of the present invention is that of providing a control circuitry able to reset the bitlines after the minimum feasible time while allowing the sense amplifiers to switch on an acceptable bitline swing.

A further object of the invention is to provide a circuit tracking both RAM size and process, voltage and/or temperature variations.

One object of the present invention is that of providing a SRAM memory device having a reduced power consumption.

SUMMARY OF THE INVENTION

The invention relates to a pulse generator circuitry for timing a low-power memory device of a type associated to a memory matrix, including a plurality of word lines driven by a row decoder, and a plurality of bit lines sensed by sense amplifiers. The matrix includes at least a dummy row and at least one dummy column. A delay chain of the pulse generator is formed by the dummy datapath of the memory matrix. The dummy datapath being defined by at least on dummy row and at least one dummy column. The datapath operates prior to the operation of the normal row and column path of the matrix.

In another embodiment disclosed, the row decoder comprises a dummy row enable portion at the intersection between the dummy row and the dummy column. The delay chain includes at least the dummy row enable portion, the dummy row and the dummy column.

BRIEF DESCRIPTION OF THE DRAWINGS

The accompanying drawings provide a further understanding of the invention and are incorporated in and constitute a part of this specification. The drawings illustrate preferred embodiments of the invention, and, together with the description, serve to explain the principles of the invention.

FIG. 4A shows a schematic diagram of an integrated memory device including a self-timing circuitry according to a further prior art solution.

FIG. 4B shows a simplified schematic diagram of a circuit portion included in the self-timing circuitry of FIG. 4A.

FIG. 4C shows a schematic timing diagram of timing signals inside the integrated memory device of FIG. 4A.

FIG. 5A shows a schematic diagram of an integrated memory device including a self-timing circuitry according to the present invention.

FIG. 5B shows a simplified schematic diagram of a circuit portion included in the self-timing circuitry of the invention.

FIG. 5C shows a schematic timing diagram of timing signals inside the integrated memory device of the invention.

DETAILED DESCRIPTION OF AN EMBODIMENT

Figure 1:
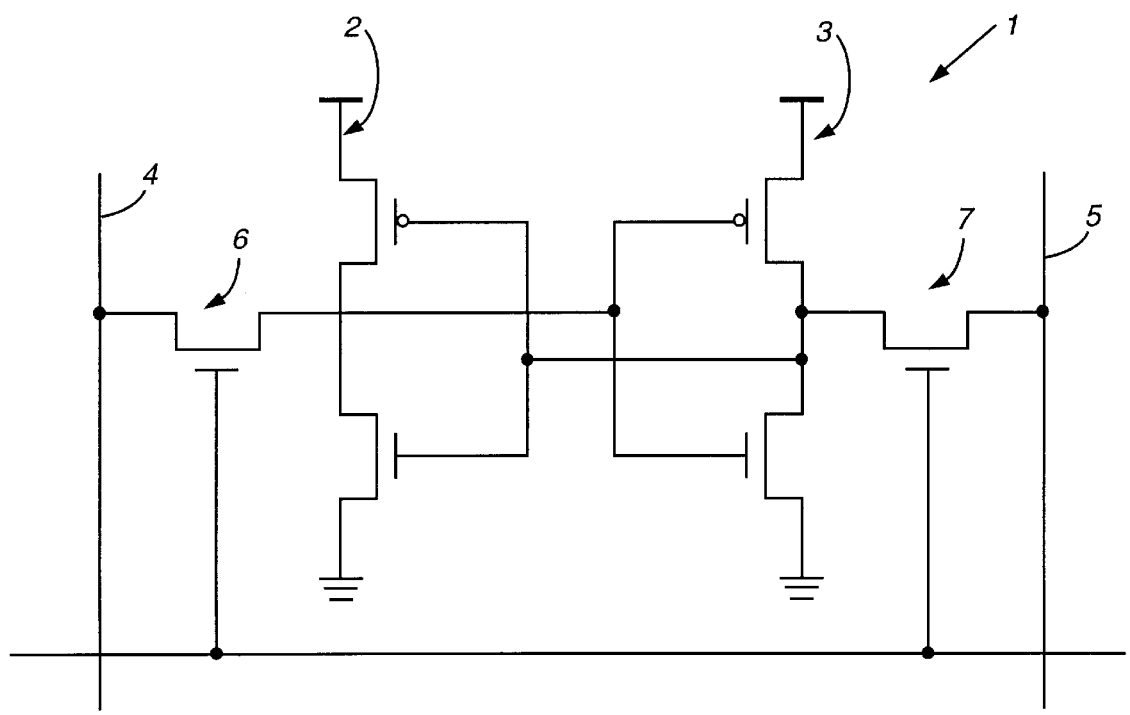
FIG. 1 shows a simplified schematic diagram of a conventional and known double bit-line CMOS SRAM memory cell.
Figure 2:
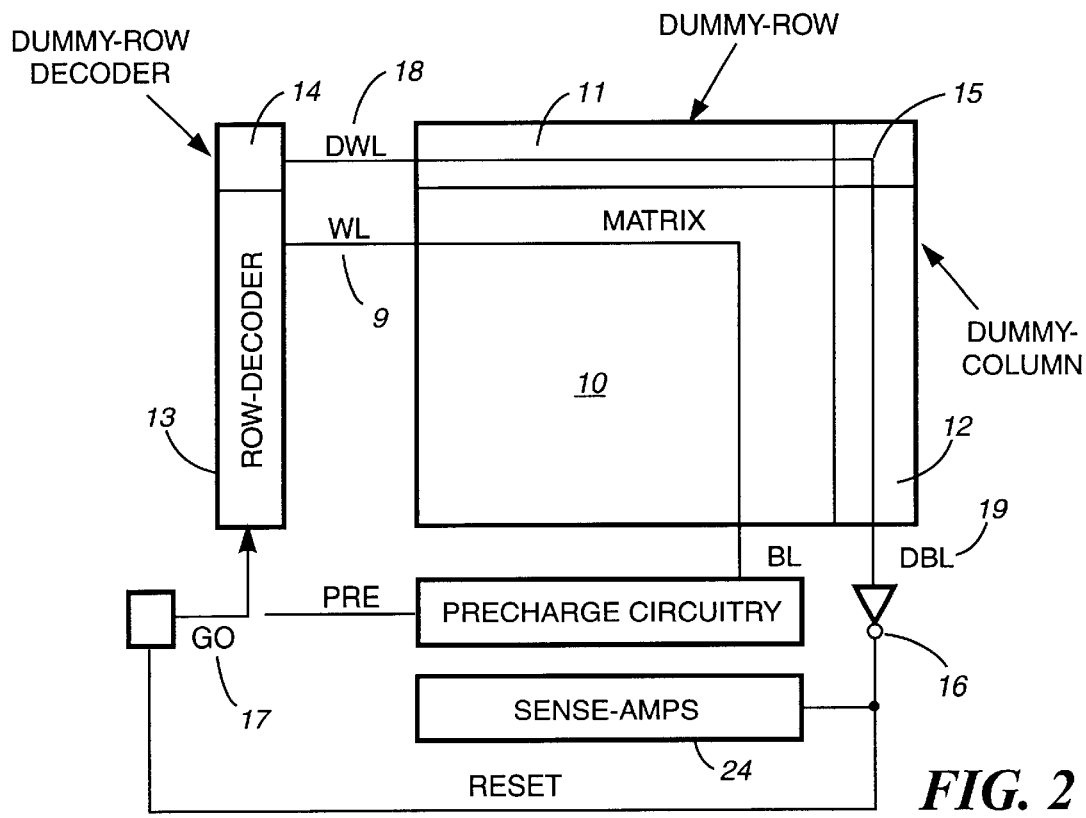
FIG. 2 shows a simplified schematic diagram of an integrated memory device including a self-timing circuitry according to the prior art.
Figure 3:
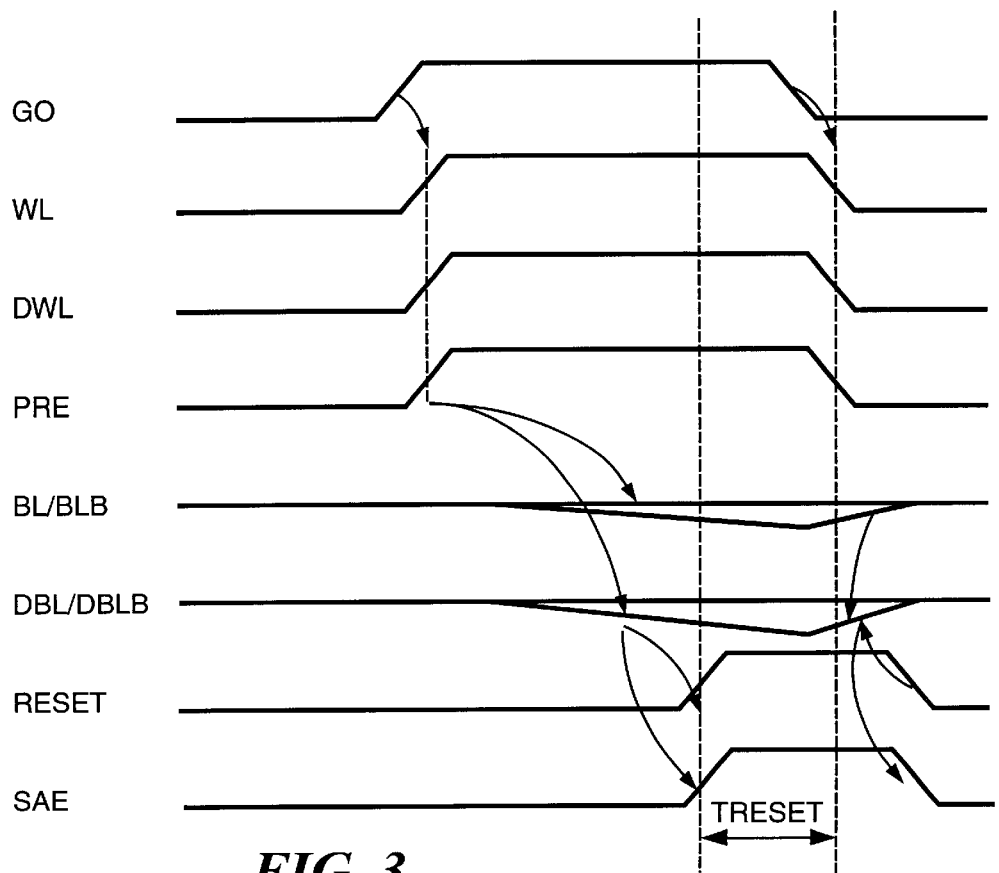
FIG. 3 shows a schematic timing diagram of timing signals inside the integrated memory device of FIG. 2.

With specific reference to the example of FIGS. 5A, 5B and 5C, it is disclosed an integrated memory circuit and, more particularly, an integrated static random access memory SRAM.

The memory device according to the present invention is globally indicated with the numeral 30. This memory device 30 is specifically designed for a low-power comsumption and includes a pulse generator circuit according to the present invention.

The memory device 30 comprises a memory matrix 39 formed by a plurality of memory cells. The matrix cells are organized in rows, or wordlines, and columns, or bitlines.

The memory device includes at least a dummy row 31 and at least a dummy column 32.

A row decoder 33 is associated to the memory matrix. Such a row decoder includes a portion 34 specifically provided for the dummy row 31. Such a portion 34 is a dummy row enable block.

A delay line or chain 37 is provided according to the present invention to track the normal datapath through the memory device.

Advantageously, the delay chain 37 is realized using a dummy path on the matrix dummy row 31, the matrix dummy column 32 and the row decoder 33.

This delay chain 37 can be tuned to a desired and predetermined voltage difference value on the normal bit lines. For instance, a programmable setting of a Vdd partition, such as: Vdd/2, or Vdd/4, or Vdd/8, or Vdd/16, may be choosen.

According to the invention, the first element of the delay chain 37 is the dummy row enable block 34 which is serially connected to the dummy row 31.

The dummy row 31 together with the dummy column 32 represent a second element of the delay chain according to the invention.

A dummy sense amplifier 35 is downstream connected to the dummy column 32.

This dummy sense amplifier 35 is a third element of the delay chain.

A schematic view of the delay chain 37 is shown in FIG. 5B.

According to the invention the dummy datapath operates prior than the real datapath. On the contrary, in prior art solutions the signals propagate through the dummy path simultaneously to the signals crossing the real datapath.

A pulse is created inside the delay chain 37 whose width corresponds exactly to a desired pulse width. The datapath is enable by the pulse width and the sense amplifiers sample the bit lines on the pulse falling edge.

No extra delay is due to the propagation of a reset signal through the memory device.

The dummy circuitry of the invention is therefore able to track the size of the memory matrix as well as the process, voltage and/or temperature variations.

The delay chain 37 formed by the dummy path corresponds and has the same properties of a real datapath and achieves self-timing characteristics.

The inventive solution looks like the known "one-shot" pulse generator; however, rather than building the delay line from an arbitrary inventor gate delay chain, the delay line 37 according to the invention is realized to track the normal datapath through the memory device.

Therefore, the signals don't propagate through the dummy path simultaneously to the signals going through the real datapath. On the contrary, the dummy datapath operates prior to the real datapath.

The pulse generator according to the invention allows to achieve a reduction of the power consumption by controlling the wordline pulse width.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A pulse generator circuitry for timing a low-power memory device of a type associated to a memory matrix, including a plurality of word lines driven by a row decoder, and a plurality of bit lines sensed by sense amplifiers, the matrix including at least a dummy row and at least a dummy column, the pulse generator circuit comprising:
   a delay chain formed by the dummy data path of the memory matrix, wherein the dummy data path comprises at least one dummy row and at least one dummy column, wherein the dummy row includes at least one dummy word line and wherein the dummy word line is activated prior to the word lines of the memory matrix.

2. The pulse generator circuitry according to claim 1, wherein the row decoder comprises a dummy row enable portion at the intersection between the dummy row and the dummy column.

3. The pulse generator circuitry according to claim 2, wherein the delay chain comprises at least the dummy row enable portion, the dummy row and the dummy column.

4. The pulse generator circuitry according to claim 1, wherein the delay chain is tuned to a predetermined voltage difference, taken by a partition of a supply voltage (Vdd), on the bit lines of the memory matrix.

5. The pulse generator circuitry according to claim 3, wherein a dummy sense amplifier is downstream connected to the dummy column as a third element of the delay chain.

6. The pulse generator circuitry according to claim 1, wherein the dummy datapath operates prior than the datapath defined by the rows and columns of the matrix.

7. A low-power memory device including a pulse generator circuitry, comprising:
   a memory matrix including a plurality of memory cells which are organized in rows and columns, the memory matrix including a plurality of word lines;
   a row decoder associated to the rows of the memory matrix and sense amplifiers associated to the columns of the memory matrix;
   at least a dummy row in the matrix having the same load as a memory row;
   at least a dummy column in the matrix having the same load as a memory column;
   a pulse generator circuitry comprising a delay chain which is formed by the dummy data path of the memory matrix, wherein the dummy data path comprises at least one dummy row and at least one dummy column, wherein the dummy row includes at least one dummy word line and wherein the dummy word line is activated prior to the word lines of the memory matrix.

8. The low-power memory device according to claim 7, wherein the row decoder comprises a dummy row enable portion at the intersection between the dummy row and the dummy column.

9. The low-power memory device according to claim 8, wherein the delay chain comprises at least the dummy row enable portion, the dummy row and the dummy column.

10. The low-power memory device according to claim 7, wherein the delay chain is tuned to a predetermined voltage difference, taken by a partition of a supply voltage (Vdd), on the columns of the memory matrix.

11. The low-power memory device according to claim 9, wherein a dummy sense amplifier is downstream connected to the dummy column as a third element of the delay chain.

12. The low-power memory device according to claim 7, wherein the dummy datapath operates prior than the rows and columns of the matrix.

13. A pulse generator circuitry for timing a low-power memory device of a type associated to a memory matrix, including a plurality of word lines driven by a row decoder, and a plurality of bit lines sensed by sense amplifiers, the matrix including at least a dummy row and at least a dummy column, at least one dummy sense amplifier, the pulse generator circuit comprising:

a delay chain for receiving the propagation of a self-timing signal prior to propagation through the word lines, the delay chain creating a pulse width with a falling edge, so that the sense amplifiers sample the bit lines on a falling edge of the pulse, the delay chain comprising:

a dummy row enable block which is serially connected to at least one dummy row;

at least one dummy row connected to at least one dummy column; and a dummy sense amplifier is connected to at least one dummy column.

14. An information processing system having a central processing unit, and a low-power memory device including a pulse generator circuitry, comprising:

a memory matrix including a plurality of memory cells which are organized in rows and columns, the memory matrix including a plurality of word lines;

a row decoder associated to the rows of the memory matrix and sense amplifiers associated to the columns of the memory matrix;

at least a dummy row in the matrix having the same load as a memory row;

at least a dummy column in the matrix having the same load as a memory column;

a pulse generator circuitry comprising a delay chain which is formed by the dummy data path of the memory matrix, wherein the dummy data path comprises at least one dummy row and at least one dummy column, wherein the dummy row includes at least one dummy word line and wherein the dummy word line is activated prior to the word lines of the memory matrix.

15. The information processing system according to claim 14, wherein the row decoder comprises a dummy row enable portion at the intersection between the dummy row and the dummy column.

16. The information processing system according to claim 15, wherein the delay chain comprises at least the dummy row enable portion, the dummy row and the dummy column.

17. The information processing system according to claim 16, wherein the delay chain is tuned to a predetermined voltage difference, taken by a partition of a supply voltage (Vdd), on the columns of the memory matrix.

18. The information processing system according to claim 16, wherein a dummy sense amplifier is downstream connected to the dummy column as a third element of the delay chain.

19. The information processing system according to claim 14, wherein the dummy datapath operates prior than the rows and columns of the matrix.

* * * * *